(12) United States Patent
Yang et al.

(10) Patent No.: US 10,548,215 B2
(45) Date of Patent: Jan. 28, 2020

(54) FLEXIBLE PRINTED CIRCUIT, METHOD FOR FABRICATING THE SAME, AND DISPLAY DEVICE

(71) Applicants: Beijing BOE Display Technology Co., Ltd., Beijing (CN); BOE Technology Group Co., Ltd., Beijing (CN)

(72) Inventors: Xiaojian Yang, Beijing (CN); Yubo Wang, Beijing (CN); Minghui Zhang, Beijing (CN); Inho Park, Beijing (CN); Weitao Chen, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 8 days.

(21) Appl. No.: 16/124,896

(22) Filed: Sep. 7, 2018

(65) Prior Publication Data

US 2019/0132946 A1   May 2, 2019

(30) Foreign Application Priority Data

Oct. 31, 2017   (CN) .......................... 2017 1 1045588

(51) Int. Cl.
| | |
|---|---|
| *H05K 1/02* | (2006.01) |
| *H05K 1/03* | (2006.01) |
| *H05K 1/11* | (2006.01) |
| *H05K 3/00* | (2006.01) |
| *H05K 3/10* | (2006.01) |

(Continued)

(52) U.S. Cl.
CPC .......... *H05K 1/0272* (2013.01); *H05K 1/028* (2013.01); *H05K 1/0393* (2013.01); *H05K 1/118* (2013.01); *H05K 3/007* (2013.01); *H05K 3/107* (2013.01); *H05K 3/285* (2013.01); *H05K 3/4007* (2013.01); *H05K 1/0277* (2013.01); *H05K 1/11* (2013.01); *H05K 2201/015* (2013.01);

(Continued)

(58) Field of Classification Search
CPC ...... H05K 1/0272; H05K 3/107; H05K 1/028; H05K 3/285; H05K 1/118; H05K 3/007; H05K 3/4007; H05K 2203/166; H05K 2201/10128; H05K 2201/09036; H05K 2201/015

See application file for complete search history.

(56) References Cited

U.S. PATENT DOCUMENTS

2016/0360612 A1* 12/2016 Iwase ..................... H05K 3/225
2017/0169918 A1* 6/2017 Park ......................... H01B 7/06

* cited by examiner

*Primary Examiner* — Ishwarbhai B Patel
(74) *Attorney, Agent, or Firm* — Arent Fox LLP; Michael Fainberg

(57) ABSTRACT

A flexible printed circuit, a method for fabricating the same, and a display device are provided. The circuit includes: a substrate, at least one conductive structure located on the substrate, a contact electrode group, an encapsulation layer configured to encapsulate the conductive structure and the contact electrode group, and a ventilating film. The contact electrode group includes a first and a second contact electrodes, configured to be electrically connected respectively with two ends of the conductive structure; the encapsulation layer and the substrate constitute a cavity and a liquid storage area communicating with each other; the conductive structure includes a liquid conductive substance located in the cavity; and the liquid storage area is configured to store the liquid conductive substance, and the ventilating film is configured to encapsulate the liquid storage area.

13 Claims, 15 Drawing Sheets

(51) Int. Cl.
   *H05K 3/40* (2006.01)
   *H05K 3/28* (2006.01)
(52) U.S. Cl.
   CPC .............. *H05K 2201/09036* (2013.01); *H05K 2201/10128* (2013.01); *H05K 2203/166* (2013.01)

FLEXIBLE PRINTED CIRCUIT, METHOD FOR FABRICATING THE SAME, AND DISPLAY DEVICE

CROSS-REFERENCES TO RELATED APPLICATIONS

This application claims priority to Chinese patent application No. 201711045588.2 filed on Oct. 31, 2017, which is incorporated herein by reference in its entirety.

FIELD

The present disclosure relates to the field of display technologies, and particularly to a flexible printed circuit, a method for fabricating the same, and a display device.

BACKGROUND

As the display technologies are advancing constantly, display screens or touch screens have been widely applied in our life, and particularly a Liquid Crystal Display (LCD) is predominant in the market due to a small volume, low power consumption, no radiation, and other advantages thereof. An Organic Light-Emitting Diode (OLED) display has also been widely applied in the market due to self-luminescence, a high response speed, a wide angle of view, high brightness, high saturation, a low weight, a small thickness, and other advantages thereof.

As the display technologies are advancing rapidly, there is a demand for a better display mode, display effect, etc., and more and more users require higher flexibility and tensility, more wearable displays, etc. However a traditional Flexible Printed Circuit (FPC) is not stretchable, and a signal line thereof tends to be broken in use, so a signal may be transmitted abnormally, thus hindering the display panel from displaying normally, which would result in display abnormality. Accordingly it is difficult for the flexible printed circuit in the related art to be applicable to the tensile display device or wearable device.

SUMMARY

In one aspect, an embodiment of the disclosure provides a flexible printed circuit including: a substrate, at least one conductive structure located on the substrate, at least one contact electrode group, an encapsulation layer configured to encapsulate the conductive structure and the contact electrode group, and a ventilating film. The contact electrode group includes a first contact electrode and a second contact electrode, configured to be electrically connected respectively with two ends of the conductive structure; the encapsulation layer and the substrate constitute a cavity and a liquid storage area communicating with each other; the conductive structure includes a liquid conductive substance located in the cavity; the liquid storage area is configured to store the liquid conductive substance, and the ventilating film is configured to encapsulate the liquid storage area, and to enable the liquid storage area to communicate with an ambient atmosphere.

In a possible implementation, in the flexible printed circuit above according to the embodiment of the disclosure, the liquid storage area is located on an end of the conductive structure connected with the first contact electrode.

In a possible implementation, in the flexible printed circuit above according to the embodiment of the disclosure, a positive projection of the first contact electrode and a positive projection of the liquid storage area on the substrate partially overlap with each other, and a positive projection of the second contact electrode and a positive projection of the cavity on the substrate partially overlap with each other.

In a possible implementation, in the flexible printed circuit above according to the embodiment of the disclosure, the encapsulation layer includes a first encapsulation layer and a second encapsulation layer located on the side of the first encapsulation layer away from the substrate; and a surface of the first encapsulation layer away from the substrate is flush with a surface of the liquid storage area, and a surface of the second encapsulation layer away from the substrate is flush with a surface of the ventilating film.

In a possible implementation, in the flexible printed circuit above according to the embodiment of the disclosure, a part of a surface of the first contact electrode close to the substrate is exposed; or a part of the surface of the first contact electrode away from the substrate is exposed; and a part of the surface of the second contact electrode close to the substrate is exposed; or a part of the surface of the second contact electrode away from the substrate is exposed.

In a possible implementation, in the flexible printed circuit above according to the embodiment of the disclosure, a diameter of an aperture of the ventilating film lies between a diameter of a largest one of air molecules and a diameter of a particle of the liquid conductive substance.

In a possible implementation, in the flexible printed circuit above according to the embodiment of the disclosure, the ventilating film includes expanded polytetrafluoroethylene.

In a possible implementation, in the flexible printed circuit above according to the embodiment of the disclosure, the liquid conductive substance includes liquid metal or electrolyte solution, and the liquid metal includes an indium-tin-gallium alloy material or mercury.

In a possible implementation, in the flexible printed circuit above according to the embodiment of the disclosure, the substrate includes a resin material, and the encapsulation layer includes a resin material.

In another aspect, an embodiment of the disclosure provides a display device including the flexible printed circuit above.

In still another aspect, an embodiment of the disclosure provides a method for fabricating the flexible printed circuit above. The method includes: preparing a substrate; forming at least one contact electrode group on the substrate; forming an encapsulation layer in a 3D printing process, wherein a cavity configured to accommodate a liquid conductive substance, and a liquid storage area communicating with the cavity are arranged on a side of the encapsulation layer close to the substrate; injecting the liquid conductive substance into the liquid storage area to enable the liquid conductive substance to connect with the contact electrode group; and encapsulating the liquid storage area using a ventilating film.

In still another aspect, an embodiment of the disclosure provides a method for fabricating the flexible printed circuit above. The method includes preparing a substrate; forming at least one contact electrode group on the substrate; forming a conductive layer of liquid metal at temperature below a melting point of the liquid metal, and patterning the conductive layer, wherein the conductive layer is connected with the at least one contact electrode group; forming an encapsulation layer to encapsulate the conductive layer and the contact electrode group at temperature below the melting point of the liquid metal to form a cavity and a liquid storage area of the conductive structure; and forming a ventilating film to encapsulate the liquid storage area.

In still another aspect, an embodiment of the disclosure provides a method for fabricating the flexible printed circuit above. The method includes preparing a base substrate; forming an encapsulation layer on the base substrate, wherein a groove configured to accommodate a liquid conductive substance, and a liquid storage area communicating with the groove are arranged on the encapsulation layer, and a ventilating film is arranged on a side of the liquid storage area close to the base substrate; filling the liquid conductive substance in the groove and the liquid storage area on the encapsulation layer; preparing a substrate; forming at least one contact electrode group on the substrate; aligning the base substrate with the liquid conductive substance filled, with the substrate with the contact electrode group formed; and removing the base substrate.

DETAILED DESCRIPTION

Figure 1:
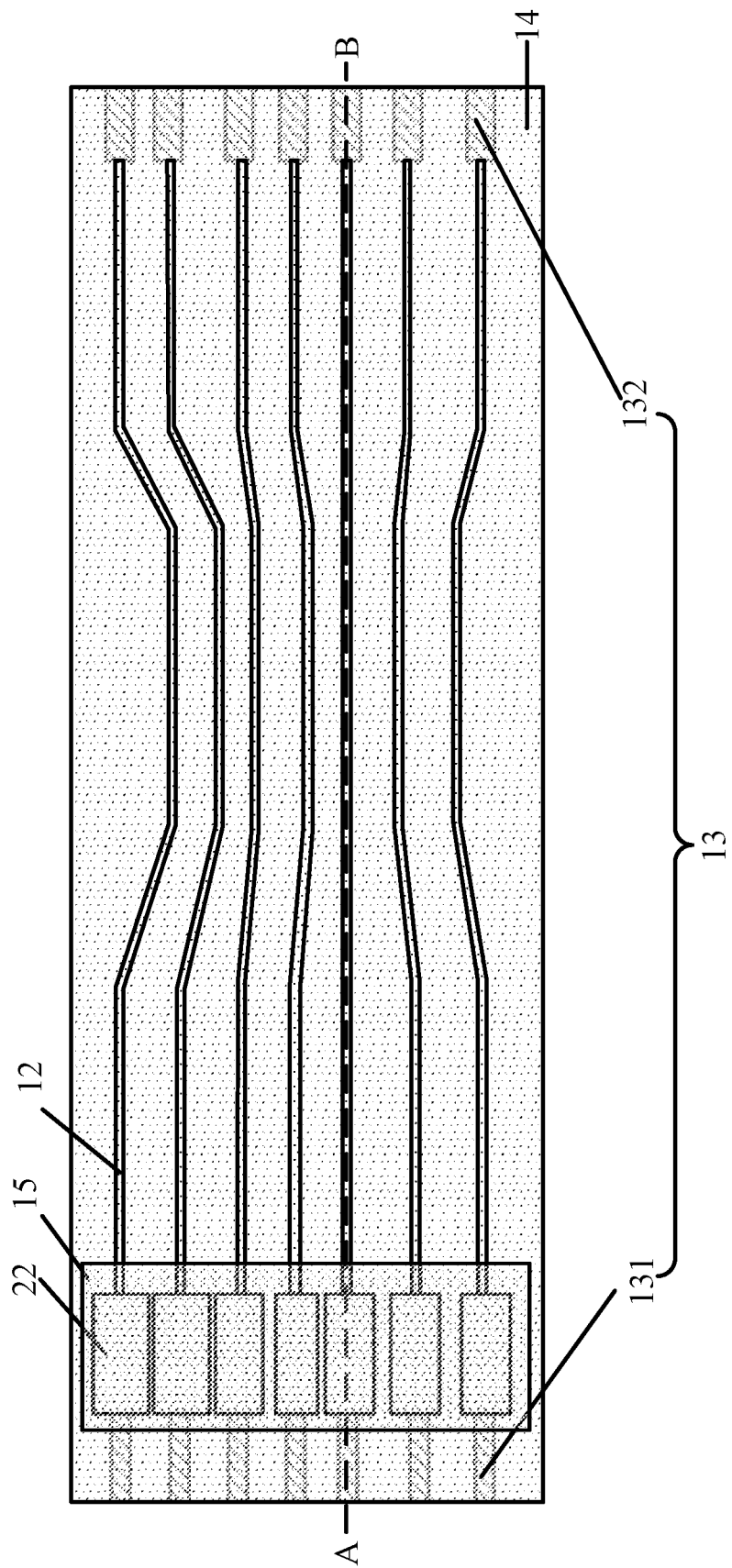
FIG. 1 is a top view of a flexible printed circuit according to an embodiment of the disclosure.

In view of the problem in the related art that a flexible printed circuit is not stretchable, embodiments of the disclosure provide a flexible printed circuit, a method for fabricating the same, and a display device.

Implementations of the flexible printed circuit, the method for fabricating the same, and the display device according to the embodiments of the disclosure will be described below in details with reference to the drawings. The thicknesses and shapes of respective layers in the drawings are not intended to reflect any real proportion, but merely intended to illustrate the content of the disclosure.

Figure 2A:
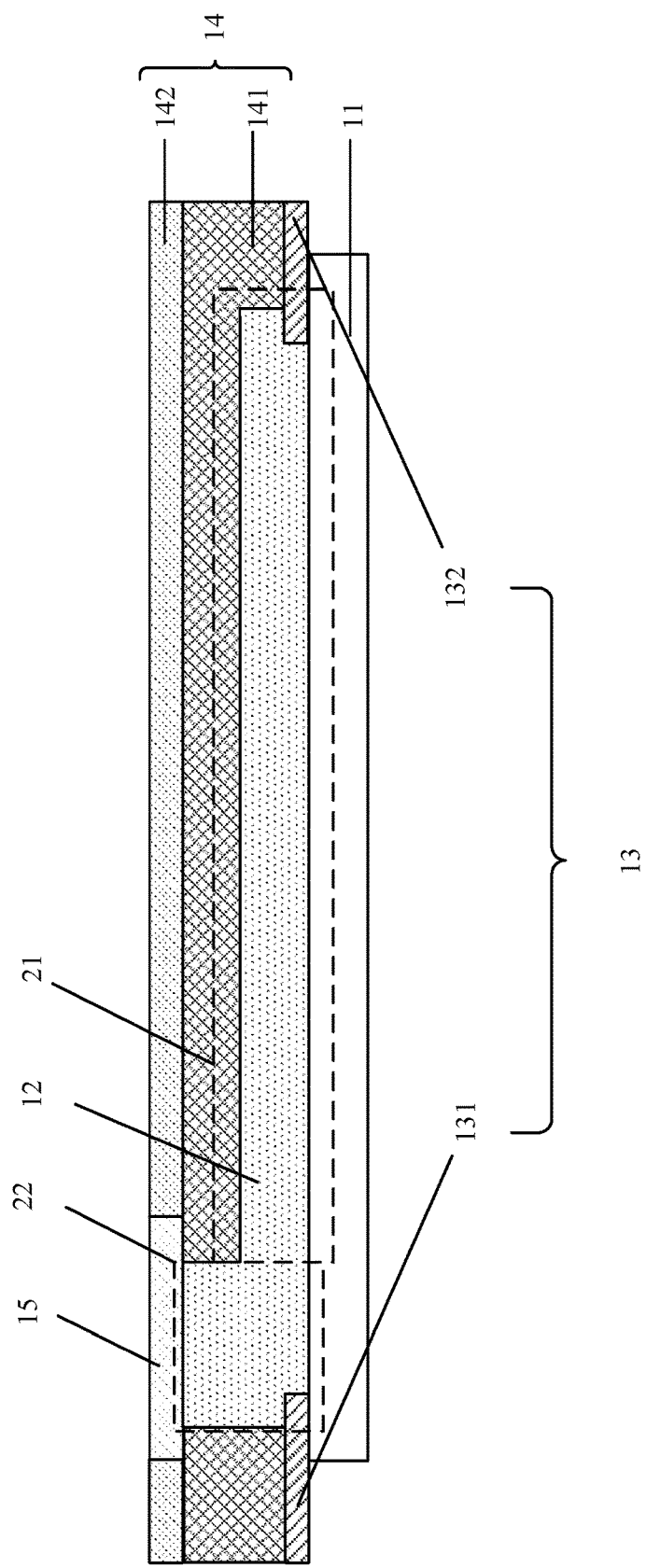
FIG. 2A and FIG. 2B are schematic sectional views along AB in FIG. 1.
Figure 2B:
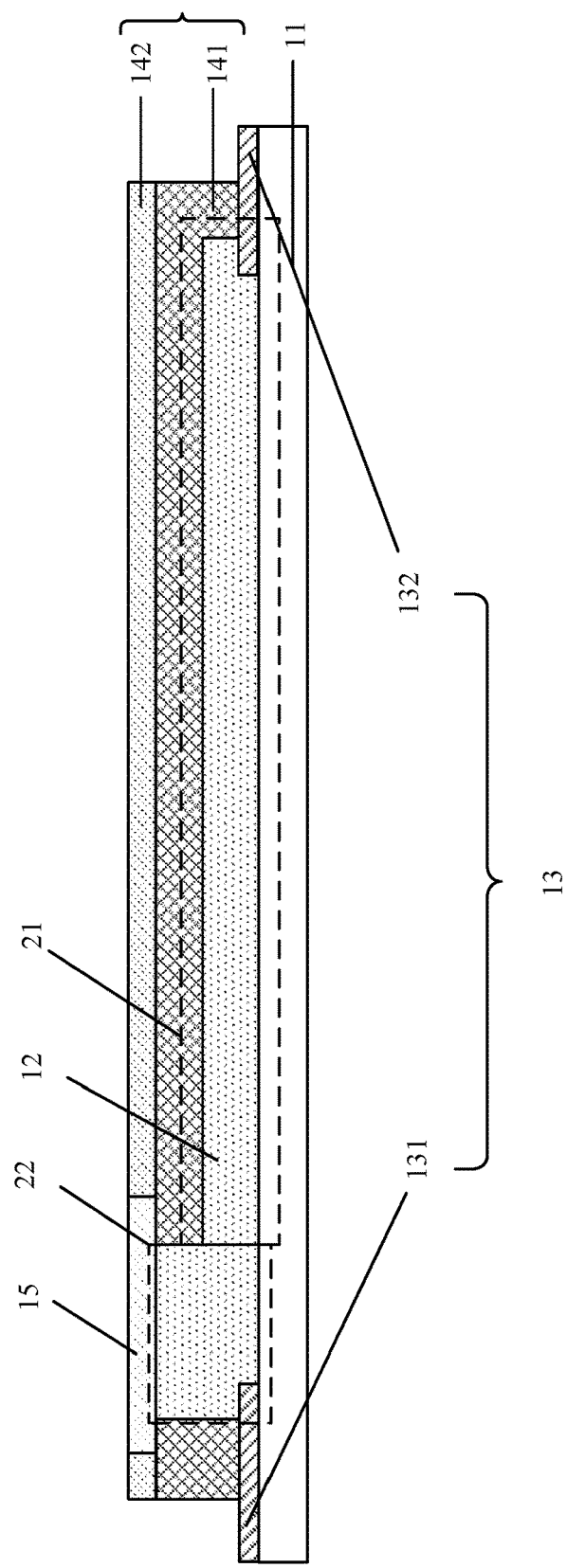

In one aspect, an embodiment of the disclosure provides a flexible printed circuit, and as illustrated in FIG. 1, FIG. 2A, and FIG. 2B, the flexible printed circuit includes: a substrate 11, at least one conductive structure 12 located on the substrate 11, at least one contact electrode group 13, an encapsulation layer 14 configured to encapsulate the at least one conductive structure 12 and the at least one contact electrode group 13, and a ventilating film 15.

The contact electrode group 13 includes a first contact electrode 131 and a second contact electrode 132, configured to be electrically connected respectively with two ends of the conductive structure.

The encapsulation layer and the substrate constitute at least one cavity 21 and at least one liquid storage area 22 communicating with each other.

The conductive structure 12 includes a liquid conductive substance located in the cavity 21.

The liquid storage area 22 is configured to store the liquid conductive substance, and the ventilating film 15 is configured to encapsulate the liquid storage area 22, and to enable the liquid storage area 22 to communicate with the ambient atmosphere.

In the flexible printed circuit above according to the embodiment of the disclosure, the substrate and the encapsulation layer are generally stretchable, and the conductive structure 12 includes the liquid conductive substance located in the cavity 21, so while the flexible printed circuit is being stretched, the liquid conductive substance in the cavity 21 flows with varying atmospheric pressure, so that the liquid conductive substance is connected with the first contact electrode 131 and the second contact electrode 132, thus enabling the flexible printed circuit to be stretchable while ensuring the conductivity of the flexible printed circuit.

As illustrated in FIG. 1, in an implementation, the first contact electrode 131 and the second contact electrode 132 in each contact electrode group 13 are typically arranged on two ends of the flexible printed circuit, and a conductive structure 12 is connected respectively with the first contact electrode 131 and the second contact electrode 132 located on two tends thereof, so two components can be connected through the flexible printed circuit. FIG. 1 illustrates seven conductive structures 12 and seven contact electrode groups 13 by way of an example, but the embodiment of the disclosure will not be limited to any specific numbers of conductive structures 12 and of contact electrode groups 13. In some embodiments, the first contact electrode 131 and the second contact electrode 132 generally can be made of a metal material, and for example, the first contact electrode and the second contact electrode can be copper electrodes, or the first contact electrode and the second contact electrode can be made of another conductive material which can be flexible or rigid. Since the first contact electrode and the second contact electrode are typically located respectively on two ends of the flexible printed circuit, a stress occurring on the flexible printed circuit being stretched cannot be concentrated on the first contact electrode and the second contact electrode, so the stretchability of the flexible printed circuit cannot be affected by the first contact electrode and the second contact electrode, and the first contact electrode and the second contact electrode cannot be broken while the flexible printed circuit is being stretched.

In some embodiments, referring to FIG. 1, since each conductive structure 12 is connected with the first contact electrode 131 and the second contact electrode 132 located on two ends of the conductive structure, two adjacent conductive structures 12 shall be insulated from each other, so one conductive structure 12 corresponds to one liquid storage area 22. Furthermore in order to facilitate a fabrication process, several adjacent conductive structures 12 can share a ventilating film 15, although the embodiment of the disclosure will not be limited to any specific number of ventilating films 15 and any specific number of liquid storage areas 22.

The flexible printed circuit above according to the embodiment of the disclosure is configured to connect a display screen with a Printed Circuit Board (PCB) in a display device, and specifically the flexible printed circuit can be connected respectively with contact pads on the display screen through the first contact electrodes (e.g., golden fingers) located on the same end thereof, and connected respectively with contact pads on the printed circuit board through the second contact electrodes located on the other end thereof. Furthermore the flexible printed circuit can also be applicable to other devices, e.g., a wrist ring, a wrist watch, or other devices, although the flexible printed circuit will not be limited to any specific application thereof.

Referring to FIG. 1, FIG. 2A, and FIG. 2B, in the flexible printed circuit above according to the embodiment of the disclosure, the substrate and the encapsulation layer can be made of a material which is stretchable, so the substrate 11 and the encapsulation layer 14 can be stretchable. The conductive structure 12, which roles as electric conduction, includes the liquid conductive substance located in the cavity 21. Since the liquid conductive substance can flow, the conductive structure 12 cannot be broken while the flexible printed circuit is being stretched. FIG. 1 merely illustrates the shape of the conductive structure 12 in one implementation of the embodiment of the disclosure, and the shape of the conductive structure 12 can be set as needed in reality, although the embodiment of the disclosure will not be limited thereto.

Furthermore the liquid storage area 22 is arranged to store the liquid conductive substance, and the ventilating film 15 is arranged to encapsulate the liquid storage area 22, and to enable the liquid storage area 22 to communicate with the ambient atmosphere, so that the liquid conductive substance can flow to lower atmospheric pressure while the flexible printed circuit is being stretched, to thereby maintain good contact of the conductive structure 12 with the first contact electrode 131 and the second contact electrode 132 after flexible printed circuit is stretched, so as to guarantee the conductivity. A specific stretching process will be described in details with reference to FIG. 3 and FIG. 4.

Figure 3:
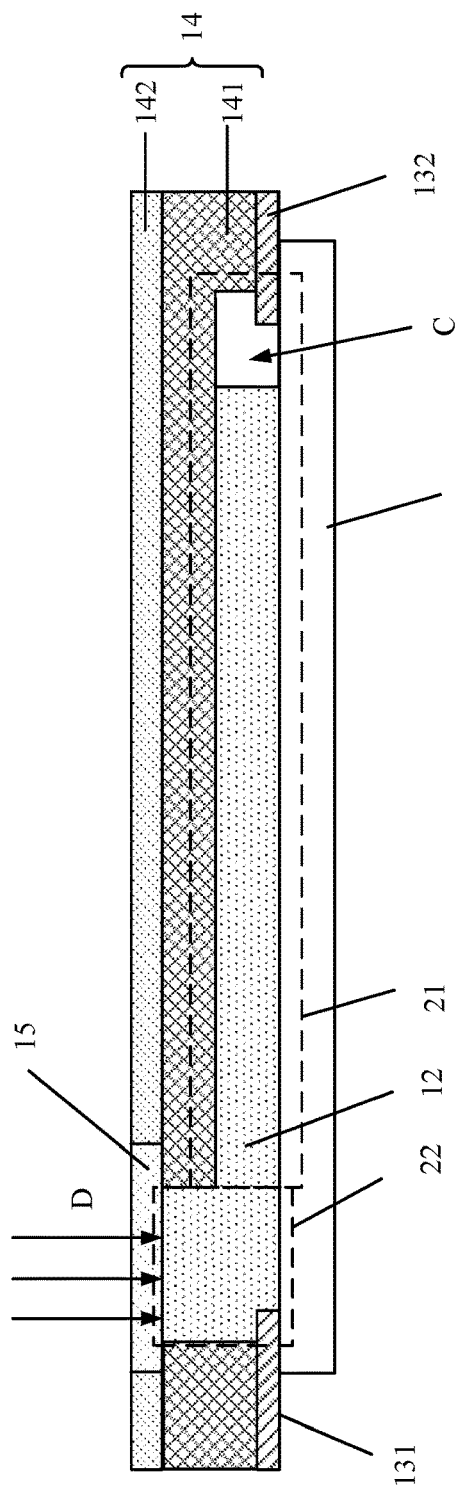
FIG. 3 is a schematic diagram of the flexible printed circuit according to the embodiment of the disclosure while being stretched.
Figure 4:
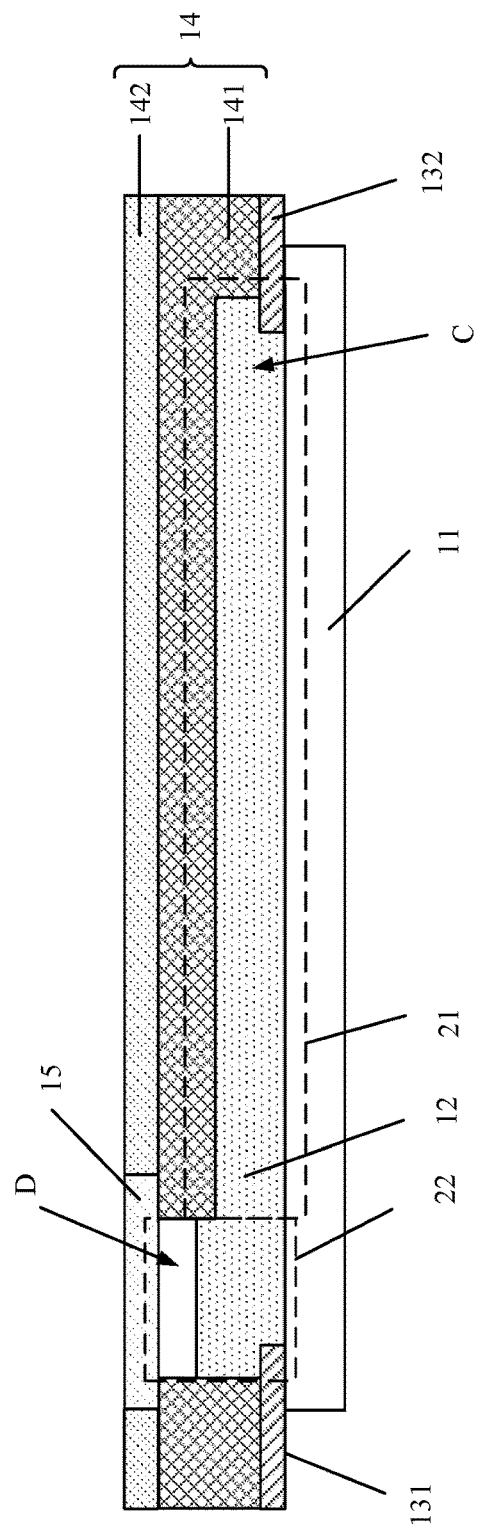
FIG. 4 is a schematic diagram of the flexible printed circuit according to the embodiment of the disclosure after being stretched.

FIG. 2A and FIG. 2B illustrates the original state of the flexible printed circuit which is not stretched, and as can be apparent, the liquid conductive substance in the cavity 21 well contacts with the first contact electrode 131 and the second contact electrode 132 on two ends thereof. As illustrated in FIG. 3, while the flexible printed circuit is being stretched, the volume of the cavity 21 is increasing, so a negative pressure area is created at the position denoted by the arrow C as illustrated, that is, the atmospheric pressure at the arrow C is lower, and the atmospheric pressure in the liquid storage area 22 communicating with the ambient atmosphere is higher, so that the liquid conductive substance in the liquid storage area 22 flows to the negative pressure area C due to the atmospheric pressure. FIG. 4 illustrates the structure of the flexible printed circuit after being stretched, where the liquid conductive substance well contacts with the first contact electrode 131 and the second contact electrode 132. In a real application, the contents of the liquid conductive substance in the cavity 21 and the liquid storage area 22 shall be set according to the extent to which the flexible printed circuit is stretched, so that the liquid conductive substance can well contact with the contact electrode group in both the original state and the stretched state.

It shall be noted that that in the embodiment of the disclosure, the liquid conductive substance above can refer to a conductive substance which is in a liquid state in an operating environment of the flexible printed circuit, but will not be limited to a conductive substance which is in a liquid state at room temperature, and for example, the liquid conductive substance can be a metal material which is in a liquid state in an operating environment. Since the liquid metal is characterized in high electrical conductivity, high thermal conductivity, high elasticity, high yield strength, etc., and heat-resistance, erosion-resistance, etc., and does not flow, and is less volatile and less oxidized at high temperature, the flexible printed circuit can be provided with good conductivity and high stability. Since the melting points of the liquid metal of different materials are different, the liquid metal material to be used shall be determined as needed in a real operating environment.

In some embodiments, in the flexible printed circuit above according to the embodiment of the disclosure, as illustrated in FIG. 2A and FIG. 2B, the liquid storage area 22 is located on the end of the conductive structure 12 connected with the first contact electrode 131, so that while the flexible printed circuit is being stretched, the liquid conductive substance flows in only one direction, thus facilitating good contact of the liquid conductive substance with the first contact electrode 131 and the second contact electrode 132 on two ends thereof; or the liquid storage area 22 can be arranged on the end of the conductive structure 12 connected with the second contact electrode 132, or the liquid storage area 22 can be at another position as needed in reality, although the embodiment of the disclosure will not be limited thereto.

Referring to FIG. 2A and FIG. 2B again, in the flexible printed circuit above according to the embodiment of the disclosure, a positive projection of the first contact electrode 131 and a positive projection of the liquid storage area 22 on the substrate partially overlap with each other, and positive projections of the second contact electrode 132 and the cavity 21 on the substrate partially overlap with each other. Thus the contact area of the first contact electrode (or the second contact electrode) with the liquid conductive substance can be increased, and the conductive structure 12 cannot be easily disconnected from the first contact electrode (or the second contact electrode), thus guaranteeing the conductivity of the flexible printed circuit. By way of an example in which the positive projections of the second contact electrode and the cavity on the substrate partially overlap with each other, there is an overlapping area between the second contact electrode and the cavity 21 on the right end of the cavity as illustrated in FIG. 2A and FIG. 2B, so that both the side of the second contact electrode and the surface of the second contact electrode located in the cavity 21 can contact with the liquid conductive substance, thus greatly increasing the contact area as compared with only the side of the second contact electrode contacting with the liquid conductive substance. The same principle will apply to the first contact electrode overlapping with the liquid storage area 22, so a repeated description thereof will be omitted here.

In some embodiments of the disclosure, in the flexible printed circuit as illustrated in FIG. 2A and FIG. 2B, the encapsulation layer 14 can include a first encapsulation layer 141 and a second encapsulation layer 142, the second encapsulation layer is located on a side of the first encapsulation layer 141 away from the substrate 11.

The surface of the first encapsulation layer 141 away from the substrate is flush with the surface of the liquid storage area 22, and the surface of the second encapsulation layer 142 away from the substrate is flush with the surface of the ventilating film 15.

As can be seen from FIG. 2A and FIG. 2B, the first encapsulation layer 141 is arranged to form the structures of the liquid storage area 22 and the cavity 21 to accommodate the liquid conductive substance, and the second encapsulation layer 142 is arranged flush with the surface of the ventilating film 15 to thereby maintain the flatness of the surface of the encapsulation layer 14 away from the substrate 11, thus making the flexible printed circuit more compact in structure. In a specific implementation, the first encapsulation layer 141 and the second encapsulation layer 142 can be made of the same material, or can be made of different materials, and the first encapsulation layer 141 and the second encapsulation layer 142 can be formed separately, or can be formed in an integral structure in the same process. In the embodiment of the disclosure, the surface of the first encapsulation layer away from the substrate is flush with the surface of the liquid storage area, and the surface of the second encapsulation layer away from the substrate is flush with the surface of the ventilating film in one implementation of the embodiment of the disclosure, but in a real application, the surface of the first encapsulation layer away from the substrate may alternatively be not flush with the surface of the liquid storage area, and the surface of the second encapsulation layer away from the substrate may alternatively be not flush with the surface of the ventilating film.

In some embodiments, in the flexible printed circuit above, a part of the surface of the first contact electrode close to the substrate 11 is exposed as illustrated in FIG. 2A, and the largest width of the encapsulation layer 14 can be set larger than the width of the substrate 11 so that the side of the first contact electrode 131 away from the conductive structure 12 is flush with the encapsulation layer 14 to thereby expose a part of the surface of the first contact electrode 131 close to the substrate 11; or a part of the surface of the first contact electrode 131 away from the substrate 11 is exposed as illustrated in FIG. 2B, and the width of the substrate 11 can be set larger than the largest width of the encapsulation layer 14 so that the side of the first contact electrode 131 away from the conductive structure 12 is flush with the substrate 11 to thereby expose a part of the surface of the first contact electrode 131 away from the substrate 11. Alike a part of the surface of the second contact electrode close to the substrate can be exposed, or a part of the surface of the second contact electrode away from the substrate can be exposed. In this way, on one hand, the first contact electrode (or the second contact electrode) can be electrically connected with the liquid conductive substance sealed between the substrate and the encapsulation layer, and on the other hand, the exposed part of the surface of the first contact electrode (or the second contact electrode) can be connected with another component, e.g., a contact pad on the display screen.

In some embodiments, in order to enable the liquid storage area 22 to communicate with the atmosphere, and to avoid the liquid metal in the liquid storage area 22 from flowing out of the ventilating film 15, in the flexible printed circuit above, the diameter of an aperture of the ventilating film 15 lies between the diameter of the largest one of air molecules and the diameter of a particle of the liquid conductive substance. In some embodiments, the ventilating film 15 above includes expanded polytetrafluoroethylene.

In a real application, the liquid conductive substance above is a substance which is in a liquid state in an operating environment of the flexible printed circuit, so the material of the liquid conductive substance can be set as needed in a real operating environment. Since an operating environment of a mobile phone, a TV set, a computer, or another display device is typically at room temperature, and may be below zero centigrade in some special case, the liquid conductive substance may be a material with a low melting point, and for example, the liquid conductive substance may include an indium-tin-gallium alloy material with a melting point of approximately −19☐, and a bolting point of approximately 1300☐, that is, the indium-tin-gallium alloy is in a liquid state at temperature above −19☐, and the indium-tin-gallium alloy material is relatively stable, so it can operate in a normal operating environment. Specifically the proportion of the respective elements in the indium-tin-gallium alloy material can be Ga:In:Sn=68.5%:21.5%:10%. Furthermore the liquid conductive substance can alternatively be electrolyte solution or mercury, or can be another material which can operate in a normal operating environment, although the embodiment of the disclosure will not be limited thereto.

In the flexible printed circuit in some embodiments of the disclosure, the substrate 11 includes a resin material, and the encapsulation layer 14 includes a resin material. Specifically both the first encapsulation layer 141 and the second encapsulation layer 142 in the encapsulation layer 14 can be made of a resin material. Since the resin material has some elasticity, it can enable the flexible printed circuit to be stretchable. In some embodiments, the resin material above is elastic resin, or can be made of another material with a good stretch effect, although the embodiment of the disclosure will not be limited to any specific materials of the substrate 11 and the encapsulation layer 14.

In another aspect, based upon the same inventive idea, an embodiment of the disclosure further provides a display device including the flexible printed circuit above. The display device can be applicable to a mobile phone, a tablet computer, a TV set, a monitor, a notebook computer, a digital photo frame, a navigator, or any other product or component with a display function. Since the display device addresses the problem under a similar principle to the flexible printed circuit above, reference can be made to the implementation of the flexible printed circuit above for an implementation of the display device, and a repeated description thereof will be omitted here.

In still another aspect, based upon the same inventive idea, an embodiment of the disclosure further provides a method for fabricating the flexible printed circuit above. Since the fabricating method addresses the problem under a similar principle to the flexible printed circuit above, reference can be made to the implementation of the flexible printed circuit above for an implementation of the fabricating method, and a repeated description thereof will be omitted here.

Figure 5:
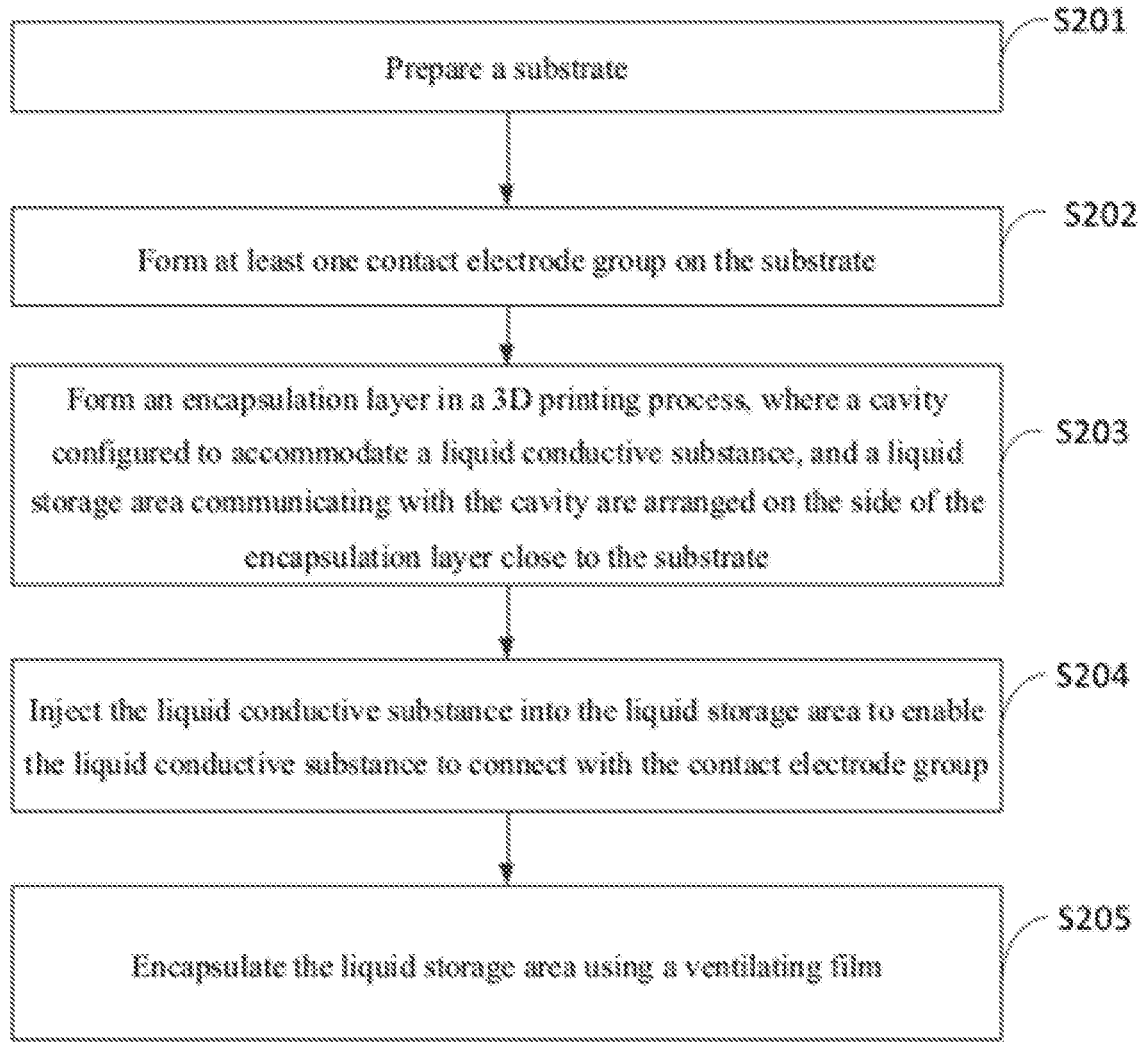
FIG. 5 is a first flow chart of a method for fabricating the flexible printed circuit above according to an embodiment of the disclosure.

As illustrated in FIG. 5, a method for fabricating the flexible printed circuit above according to an embodiment of the disclosure can include the following steps.

The step S201 is to prepare a substrate 11, e.g., a substrate 11 made of an elastic resin so that the resulting substrate is stretchable, or a substrate 11 made of another material, although the embodiment of the disclosure will not be limited to any specific material of the substrate 11.

Figure 6A:
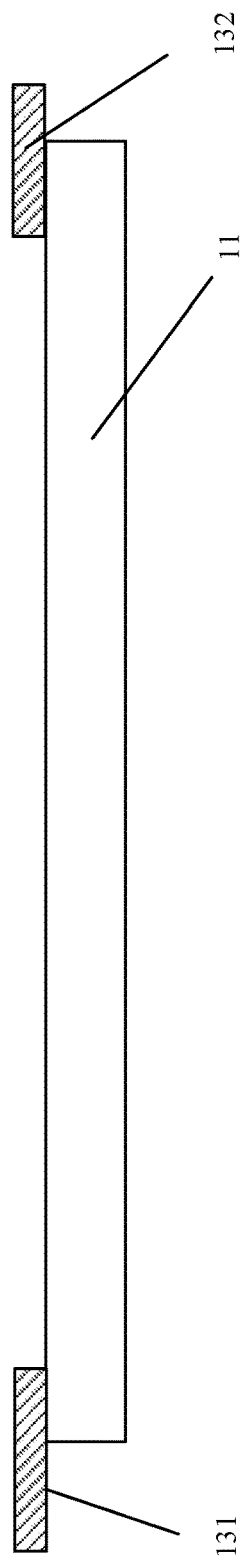
FIG. 6A to FIG. 6C, FIG. 8, and FIG. 10A to FIG. 10C are schematic structural diagrams in the fabricating method above according to the embodiment of the disclosure.

The step S202 is to form at least one contact electrode group on the substrate 11, where as illustrated in FIG. 6A, the contact electrode group includes a first contact electrode and a second contact electrode located on two ends of the substrate 11, and the first contact electrode and the second contact electrode extend outward relative to the substrate 11 so that parts of the surfaces of the first contact electrode and the second contact electrode close to the substrate 11 are exposed, or if parts of the surfaces of the first contact electrode and the second contact electrode to be formed away from the substrate 11 are exposed, then the sides of the first contact electrode and the second contact electrode may be arranged flush with the side of the substrate 11.

Figure 6B:
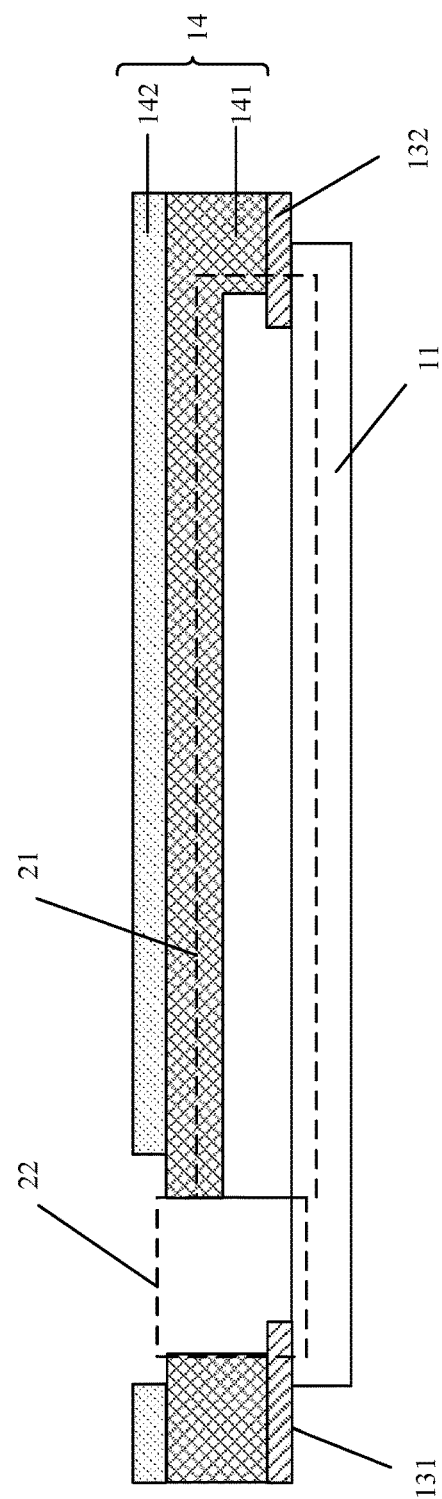

The step S203 is to form an encapsulation layer 14 by a 3D printing process, where the side of the encapsulation layer 14 close to the substrate 11 is arranged with a cavity 21 configured to accommodate a liquid conductive substance, and a liquid storage area 22 communicating with the cavity 21, as illustrated in FIG. 6B. For example, the encapsulation layer 14 can be made of elastic resin so that the encapsulation layer is stretchable, or the encapsulation layer 14 can be made of another material, although the embodiment of the disclosure will not be limited to any specific material of the encapsulation layer 14; and in the 3D printing process, the encapsulation layer 14 can be formed integrally, or the first encapsulation layer 141 and the second encapsulation layer 142 can be formed separately.

Figure 6C:
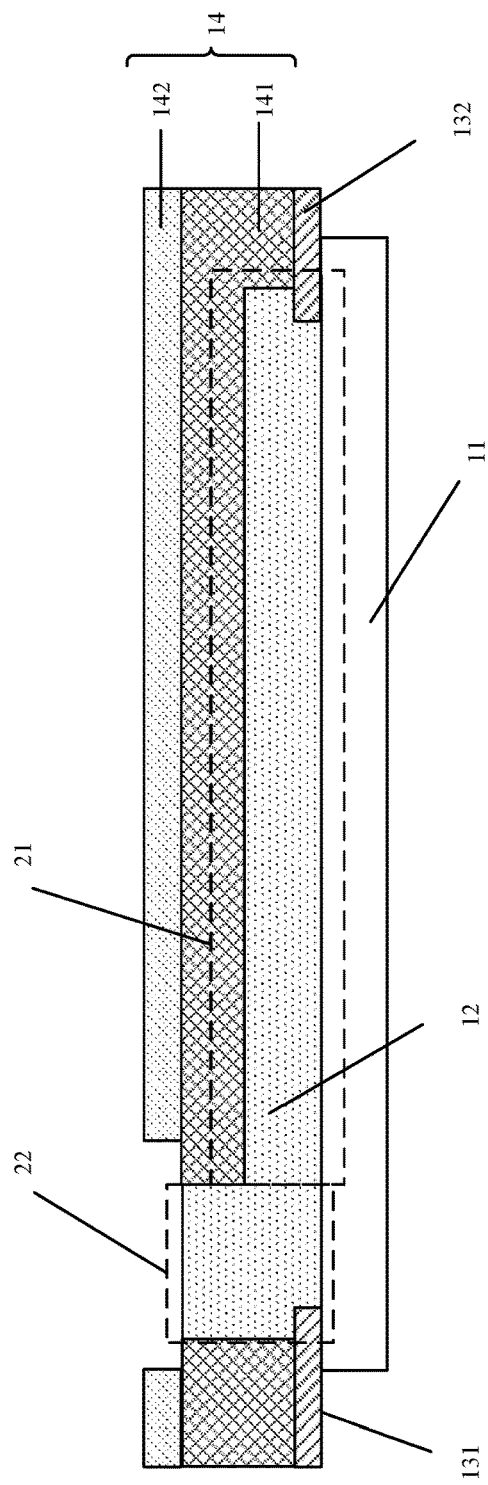

The step S204 is to inject the liquid conductive substance into the liquid storage area 22 to enable the liquid conductive substance to connect with the contact electrode group, as illustrated in FIG. 6C. In a real application, the content of the liquid conductive substance to be injected into the liquid storage area 22 shall be determined according to the extent to which the flexible printed circuit is stretched, to ensure that the liquid conductive substance can well contact with the contact electrode group in both an original state and a stretched state.

The step S205 is to encapsulate the liquid storage area 22 using a ventilating film 15, thus resulting in the structure as illustrated in FIG. 2A.

In still another aspect, based upon the same inventive idea, an embodiment of the disclosure further provides a method for fabricating the flexible printed circuit above. Since the fabricating method addresses the problem under a similar principle to the flexible printed circuit above, reference can be made to the implementation of the flexible printed circuit above for an implementation of the fabricating method, and a repeated description thereof will be omitted here.

Figure 7:
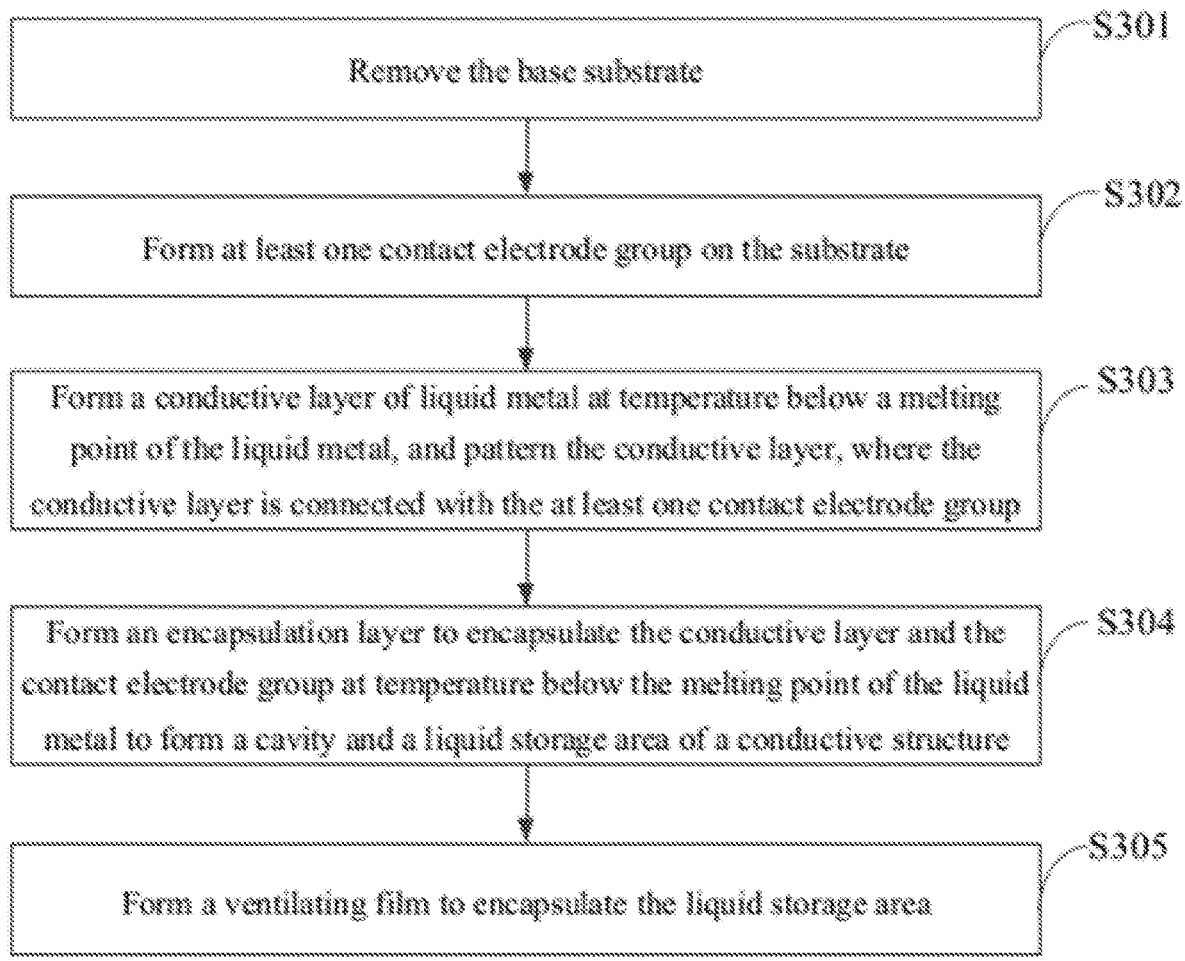
FIG. 7 is a second flow chart of a method for fabricating the flexible printed circuit above according to an embodiment of the disclosure.

As illustrated in FIG. 7, a method for fabricating the flexible printed circuit above according to an embodiment of the disclosure can include the following steps.

The step S301 is to prepare a substrate 11, e.g., a substrate 11 made of elastic resin, or a substrate 11 made of another material, although the embodiment of the disclosure will not be limited to any specific material of the substrate 11.

The step S302 is to form at least one contact electrode group on the substrate 11, where as illustrated in FIG. 6A, the contact electrode group includes a first contact electrode and a second contact electrode located on two ends of the substrate 11, and the first contact electrode (or the second contact electrode) extends outward relative to the substrate 11 so that a parts of the surface the first contact electrode (or the second contact electrode) close to the substrate 11 is exposed, or if a part of the surface of the first contact electrode (or the second contact electrode) to be formed away from the substrate 11 is exposed, then the side of the first contact electrode (or the second contact electrode) may be arranged flush with the side of the substrate 11.

Figure 8:
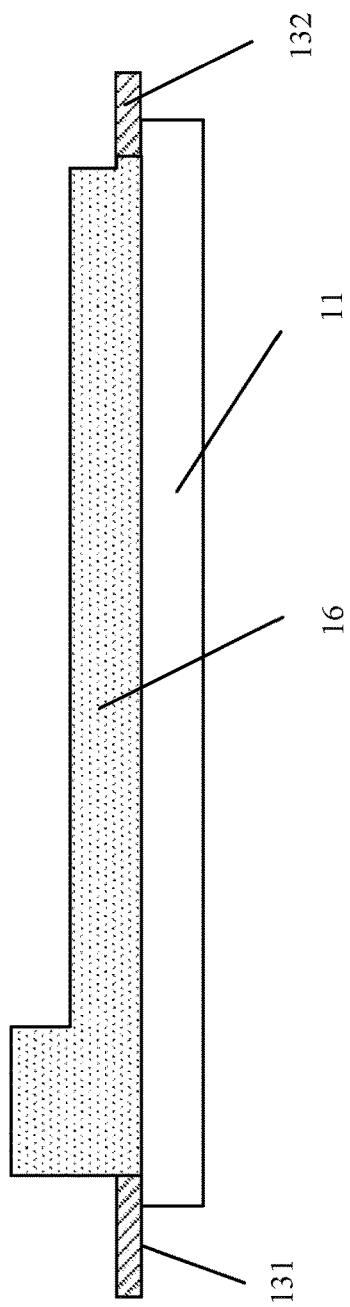

The step S303 is to form a conductive layer 16 of liquid metal at temperature below a melting point of the liquid metal, and to pattern the conductive layer 16, where the conductive layer 16 is connected with the at least one contact electrode group. The liquid metal is in a solid state at the temperature below the melting point of the liquid metal, so the conductive layer 16 can be formed in a solid state, and patterned into the structure as illustrated in FIG. 8.

The step S304 is to form an encapsulation layer 14 at temperature below the melting point of the liquid metal for encapsulating the conductive layer 16 and the contact electrode group to form a cavity 21 and a liquid storage area 22 of a conductive structure 12, as illustrated in FIG. 6C. The conductive layer 16 is still in a solid state at the temperature below the melting point of the liquid metal, and the encapsulation layer 14 is formed on the conductive layer 16 and the contact electrode group to thereby form the cavity 21 and the liquid storage area 22 of the conductive structure 12 as illustrated in FIG. 6C; and the conductive layer 16 is in a liquid state at temperature above the melting point of the liquid metal, and thus can flow in the formed cavity 21 and liquid storage area 22.

The step S305 is to form a ventilating film 15 to encapsulate the liquid storage area 22, thus resulting in the structure as illustrated in FIG. 2A.

In still another aspect, based upon the same inventive idea, an embodiment of the disclosure further provides a method for fabricating the flexible printed circuit above. Since the fabricating method addresses the problem under a similar principle to the flexible printed circuit above, reference can be made to the implementation of the flexible printed circuit above for an implementation of the fabricating method, and a repeated description thereof will be omitted here.

Figure 9:
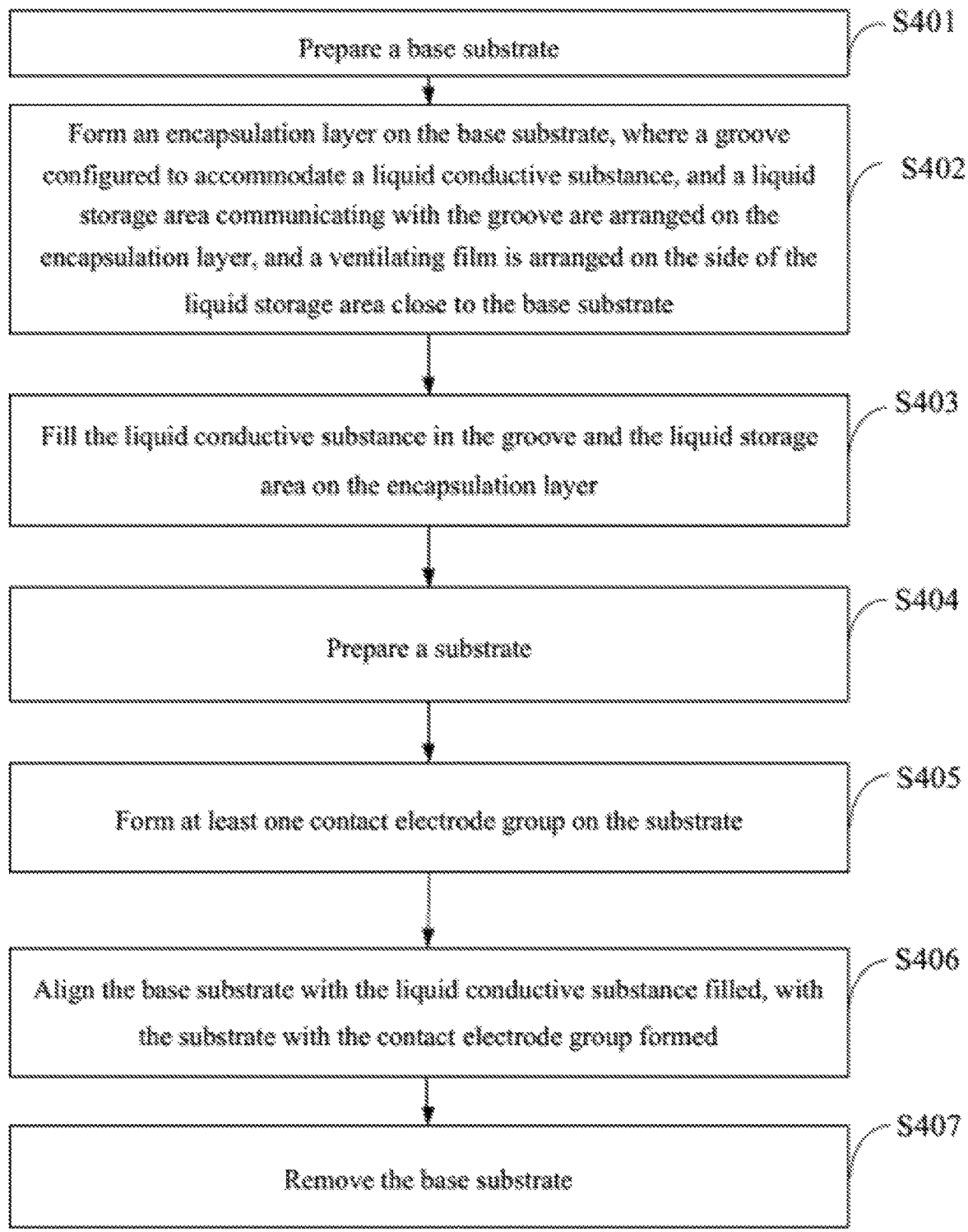
FIG. 9 is a third flow chart of a method for fabricating the flexible printed circuit above according to an embodiment of the disclosure.

As illustrated in FIG. 9, a method for fabricating the flexible printed circuit above according to an embodiment of the disclosure can include the following steps.

The step S401 is to prepare a base substrate 17, where the base substrate 17 can be a stretchable base substrate 17, or a base substrate 17 which is not stretchable, e.g., a glass substrate, although the embodiment of the disclosure will not be limited to any specific material of the base substrate 17.

Figure 10A:
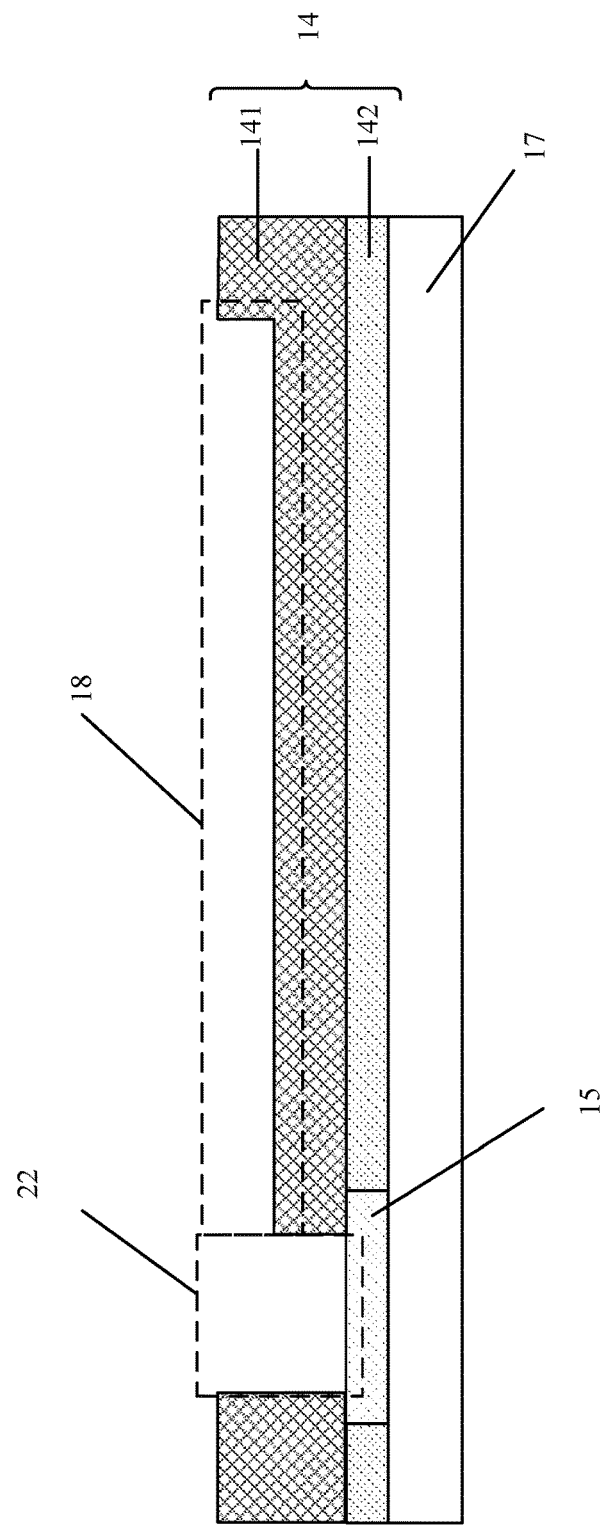

The step S402 is to form an encapsulation layer 14 on the base substrate 17, as illustrated in FIG. 10A, where a groove 18 configured to accommodate a liquid conductive substance, and a liquid storage area 22 communicating with the groove 18 are arranged on the encapsulation layer 14, and a ventilating film 15 is arranged on the side of the liquid storage area 22 close to the base substrate 17. In the fabricating method according to this embodiment, the encapsulation layer 14 is formed on the base substrate 17, and then patterned to form the groove 18 (i.e., the encapsulated cavity 21) and the liquid storage area 22 configured to accommodate the liquid conductive substance, and specifically the encapsulation layer can be formed in an integral structure in one patterning process, or a pattern of a first encapsulation layer 141, and a pattern of a second encapsulation layer 142 can be formed separately in two patterning processes to form a pattern of the encapsulation layer 14.

Figure 10B:
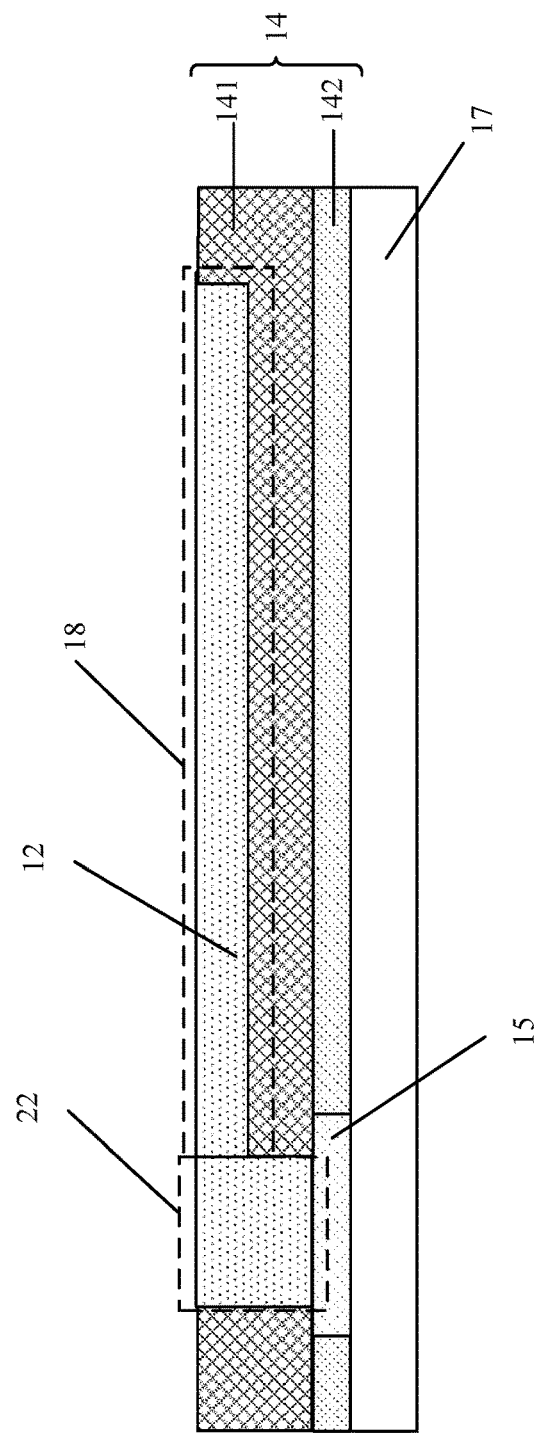

The step S403 is to fill the liquid conductive substance in the groove 18 and the liquid storage area 22 on the encapsulation layer 14, as illustrated in FIG. 10B. In a real application, the content of the liquid conductive substance to be injected into the liquid storage area 22 shall be determined according to the extent to which the flexible printed circuit is stretched, so that the liquid conductive substance can well contact with the contact electrode group in both an original state and a stretched state.

The step S404 is to prepare a substrate 11, e.g., a substrate 11 made of elastic resin so that the substrate is stretchable, or a substrate 11 made of another material, although the embodiment of the disclosure will not be limited to any specific material of the substrate 11.

The step S405 is to form at least one contact electrode group on the substrate 11. As illustrated in FIG. 6A, the contact electrode group includes a first contact electrode and a second contact electrode located on two ends of the substrate 11, and the first contact electrode (or the second contact electrode) extends outward relative to the substrate 11 so that a parts of the surface the first contact electrode (or the second contact electrode) close to the substrate 11 is exposed, or if a part of the surface of the first contact electrode (or the second contact electrode) to be formed away from the substrate 11 is exposed, then the side of the first contact electrode (or the second contact electrode) may be arranged flush with the side of the substrate 11.

Figure 10C:
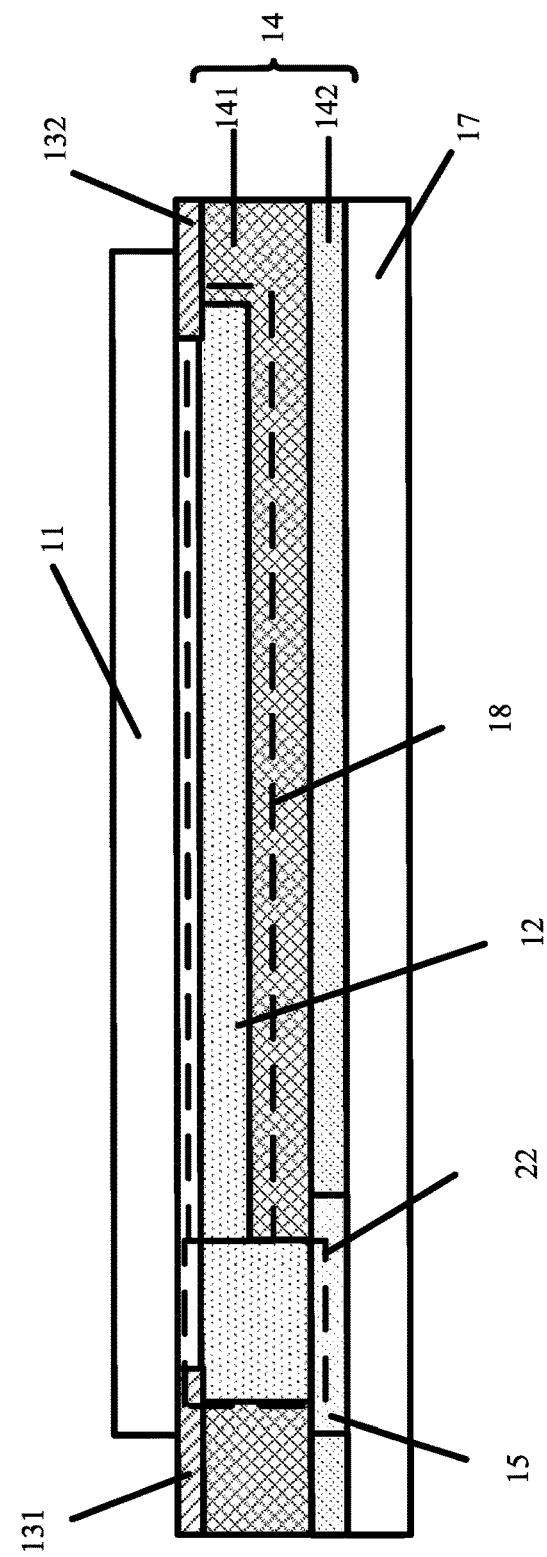

The step S406 is to align the base substrate 17 with the liquid conductive substance filled, with the substrate 11 with the contact electrode group formed, that is after the base substrate 17 is aligned with the substrate 11, they are bonded using adhesive or in another fixing mode, as illustrated in FIG. 10C.

The step S407 is to remove the base substrate 17, thus resulting in the structure as illustrated in FIG. 2A.

In this embodiment, firstly the encapsulation layer 14 is formed upside down, and the liquid conductive substance is filled, and thereafter the encapsulation layer is aligned with the substrate 11 with the contact electrode group formed, and the flexible printed circuit after they are aligned is placed upside down, thus resulting in the structure as illustrated in FIG. 2A.

In the flexible printed circuit, the method for fabricating the same, and the display device according to the embodiments of the disclosure, the conductive structure includes the liquid conductive substance located in the cavity, so while the flexible printed circuit is being stretched, the liquid conductive substance in the cavity flows with varying atmospheric pressure, so that the liquid conductive substance is connected with the first contact electrode and the second contact electrode, thus enabling the flexible printed circuit to be stretchable while being conductive.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A flexible printed circuit, comprising: a substrate, at least one conductive structure located on the substrate, at least one contact electrode group, an encapsulation layer configured to encapsulate the conductive structure and the contact electrode group, and a ventilating film, wherein:
   the contact electrode group comprises a first contact electrode and a second contact electrode, configured to be electrically connected respectively with two ends of the conductive structure;
   the encapsulation layer and the substrate constitute a cavity and a liquid storage area communicating with each other;
   the conductive structure comprises a liquid conductive substance located in the cavity; and
   the liquid storage area is configured to store the liquid conductive substance, and the ventilating film is configured to encapsulate the liquid storage area, and to enable the liquid storage area to communicate with an ambient atmosphere.

2. The flexible printed circuit according to claim 1, wherein the liquid storage area is located on an end of the conductive structure connected with the first contact electrode.

3. The flexible printed circuit according to claim 2, wherein a positive projection of the first contact electrode and a positive projection of the liquid storage area on the substrate partially overlap with each other, and a positive projection of the second contact electrode and a positive projection of the cavity on the substrate partially overlap with each other.

4. The flexible printed circuit according to claim 1, wherein the encapsulation layer comprises a first encapsulation layer and a second encapsulation layer located on a side of the first encapsulation layer away from the substrate; and
   a surface of the first encapsulation layer away from the substrate is flush with a surface of the liquid storage area, and a surface of the second encapsulation layer away from the substrate is flush with a surface of the ventilating film.

5. The flexible printed circuit according to claim 1, wherein a part of a surface of the first contact electrode close to the substrate is exposed; or a part of the surface of the first contact electrode away from the substrate is exposed; and
   a part of a surface of the second contact electrode close to the substrate is exposed; or a part of the surface of the second contact electrode away from the substrate is exposed.

6. The flexible printed circuit according to claim 1, wherein a diameter of an aperture of the ventilating film lies between a diameter of a largest one of air molecules and a diameter of a particle of the liquid conductive substance.

7. The flexible printed circuit according to claim 6, wherein the ventilating film comprises expanded polytetrafluoroethylene.

8. The flexible printed circuit according to claim 1, wherein the liquid conductive substance comprises liquid metal or electrolyte solution, and the liquid metal comprises an indium-tin-gallium alloy material or mercury.

9. The flexible printed circuit according to claim 1, wherein the substrate comprises a resin material, and the encapsulation layer comprises the resin material.

10. A display device, comprising the flexible printed circuit according to claim 1.

11. A method for fabricating the flexible printed circuit according to claim 1, the method comprising:
   preparing a substrate;
   forming at least one contact electrode group on the substrate;
   forming an encapsulation layer in a 3D printing process, wherein a cavity configured to accommodate a liquid conductive substance, and a liquid storage area communicating with the cavity are arranged on a side of the encapsulation layer close to the substrate;
   injecting the liquid conductive substance into the liquid storage area to enable the liquid conductive substance to connect with the contact electrode group; and
   encapsulating the liquid storage area using a ventilating film.

12. A method for fabricating the flexible printed circuit according to claim 1, the method comprising:
   preparing a substrate;
   forming at least one contact electrode group on the substrate;
   forming a conductive layer of liquid metal at temperature below a melting point of the liquid metal, and patterning the conductive layer, wherein the conductive layer is connected with the at least one contact electrode group;
   forming an encapsulation layer to encapsulate the conductive layer and the contact electrode group at temperature below the melting point of the liquid metal to form a cavity and a liquid storage area of the conductive structure; and forming a ventilating film to encapsulate the liquid storage area.

13. A method for fabricating the flexible printed circuit according to claim 1, the method comprising:
preparing a base substrate;
forming an encapsulation layer on the base substrate, wherein a groove configured to accommodate a liquid conductive substance, and a liquid storage area communicating with the groove are arranged on the encapsulation layer, and a ventilating film is arranged on a side of the liquid storage area close to the base substrate;
filling the liquid conductive substance in the groove and the liquid storage area on the encapsulation layer;
preparing a substrate;
forming at least one contact electrode group on the substrate;
aligning the base substrate with the liquid conductive substance filled, with the substrate with the contact electrode group formed; and
removing the base substrate.

* * * * *